United States Patent
Liu et al.

(10) Patent No.: US 9,432,178 B2
(45) Date of Patent: Aug. 30, 2016

(54) CLOCK AND DATA RECOVERY CIRCUIT USING AN INJECTION LOCKED OSCILLATOR

(71) Applicant: MEDIATEK INC., Hsin-Chu (TW)

(72) Inventors: Shiue-Shin Liu, HsinChu (TW); Chih-Chien Hung, Hualien County (TW); Shao-Hung Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/658,256

(22) Filed: Mar. 16, 2015

(65) Prior Publication Data

US 2015/0270943 A1   Sep. 24, 2015

Related U.S. Application Data

(60) Provisional application No. 61/969,270, filed on Mar. 24, 2014.

(51) Int. Cl.
| | |
|---|---|
| *H04L 7/00* | (2006.01) |
| *H04L 7/027* | (2006.01) |
| *H03L 7/099* | (2006.01) |
| *H03L 7/24* | (2006.01) |

(52) U.S. Cl.
CPC ........... *H04L 7/0276* (2013.01); *H03L 7/0995* (2013.01); *H03L 7/24* (2013.01)

(58) Field of Classification Search
CPC ..... H04L 7/033; H04L 7/037; H04L 7/0008; H04L 7/02; H04L 7/0331; H04L 7/0337; H04L 7/0338; H03L 7/0814; G06F 1/10

USPC .......... 375/371, 354, 316, 295, 219
See application file for complete search history.

(56) References Cited

U.S. PATENT DOCUMENTS

| | | | |
|---|---|---|---|
| 8,841,948 B1* | 9/2014 | Chien | H03L 7/07 |
| | | | 327/149 |
| 2002/0113660 A1 | 8/2002 | Dally | |
| 2011/0316600 A1 | 12/2011 | Lin | |
| 2013/0216003 A1 | 8/2013 | Zhuang | |
| 2014/0241442 A1* | 8/2014 | Ahmadi | H03L 7/00 |
| | | | 375/259 |

OTHER PUBLICATIONS

Kenichi Maruko et al., "A 1.296-to-5.184Gb/s Transceiver with 2.4mW/(Gb/s) Burst-mode CDR using Dual-Edge Injection-Locked Oscillator", Feb. 10, 2010, pp. 364-366, ISSCC 2010 20.3, 2010 IEEE International Solid-State Circuits Conference, Tokyo, Japan.
Yasuo Hidaka et al., "A 4-Channel 1.25-10.3 Gb/s Backplane Transceiver Macro With 35 dB Equalizer and Sign-Based Zero-Forcing Adaptive Control", Dec. 2009, pp. 3547-3559, vol. 44, No. 12, IEEE Journal of Solid-State Circuits, CA, USA.

(Continued)

*Primary Examiner* — Zewdu Kassa
(74) *Attorney, Agent, or Firm* — Winston Hsu; Scott Margo

(57) ABSTRACT

A clock and data recovery circuit includes a sampler, a skew compensation block, a pulse generator, and an injection locked oscillator. The injection locked oscillator generates a recovered clock signal, the pulse generator generates a pulse signal according to input data for controlling the injection locked oscillator, the skew compensation block compensates the input data and generate compensated data, and the sampler samples the compensated data according to the recovered clock signal.

13 Claims, 19 Drawing Sheets

(56) References Cited

OTHER PUBLICATIONS

Massimo Pozzoni et al., "A 12Gb/s 39dB Loss-Recovery Unclocked-DFE Receiver with Bi-dimensional Equalization", Feb. 9, 2010, pp. 164-166, ISSCC 2010 8.5, 2010 IEEE International Solid-State Circuits Conference, Cornaredo, Italy.

Kenichi Maruko et al., A1.296-to-5.184Gb/s Transceiver with 2.4mW/(Gb/s) Burst-mode CDR using Dual-Edge Injection-Locked Oscillator, Next-Generation Optical & Electrical Interfaces/20.3, Feb. 10, 2010, pp. 364-365, Session 20, ISSCC 2010, XP031649913, IEEEE International Solid-State Circuits Conference.

* cited by examiner

CLOCK AND DATA RECOVERY CIRCUIT
USING AN INJECTION LOCKED
OSCILLATOR

CROSS REFERENCE TO RELATED
APPLICATIONS

This non-provisional application claims priority of U.S. provisional application No. 61/969,270 filed on Mar. 24, 2014, and included herein by reference in its entirety.

BACKGROUND

A digital data communication protocol uses a data that carries both the data stream and a data clock on a single channel. In this protocol, the receiving circuit includes a clock and data recovery (CDR) circuit which produces a recovered clock, based on a local reference clock that has a frequency close to the clock carried in the data. The receiving circuit uses the recovered clock to set sampling times for sampling the data on the channel. Phase differences between the recovered clock and the data can be detected and used as feedback in the generation of the recovered clock.

Some applications need burst mode operation, i.e. the lock-in time should be within several tens of bits. Traditional burst mode CDR use gated voltage controlled oscillator (GVCO) to achieve instant locking. FIG. 1 illustrates a burst mode CDR according to an embodiment of a prior art. However, the absolute phase alignment with input data may amplify high frequency jitter of input data and degrade timing margin of the CDR. FIG. 2 illustrates an injection lock CDR suitable for burst mode operation with a complicated injection scheme. Both approaches need additional replica of the voltage controlled oscillator based on phase locked loop to control local oscillator frequency.

SUMMARY

An embodiment of the present invention presents a clock and data recovery circuit. The clock and data recovery circuit comprises an injection locked oscillator configured to generate a recovered clock signal, a pulse generator coupled to the injection locked oscillator and configured to generate a pulse signal according to input data for controlling the injection locked oscillator, and a sampler coupled to the input data and the injection locked oscillator and configured to sample the input data according to the recovered clock signal. The injection locked oscillator comprises a two stage ring oscillator and an injection switch coupled to the two stage ring oscillator and configured to control injection strength of the two stage ring oscillator.

Another embodiment of the present invention presents a method of operation of a clock and data recovery. The method comprises an injection locked oscillator generating a recovered clock signal, a pulse generator generating a pulse signal according to input data for controlling injection locked oscillator, a skew compensation block compensating for the input data and generating compensated data, and a sampler sampling the compensated data according to the recovered clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
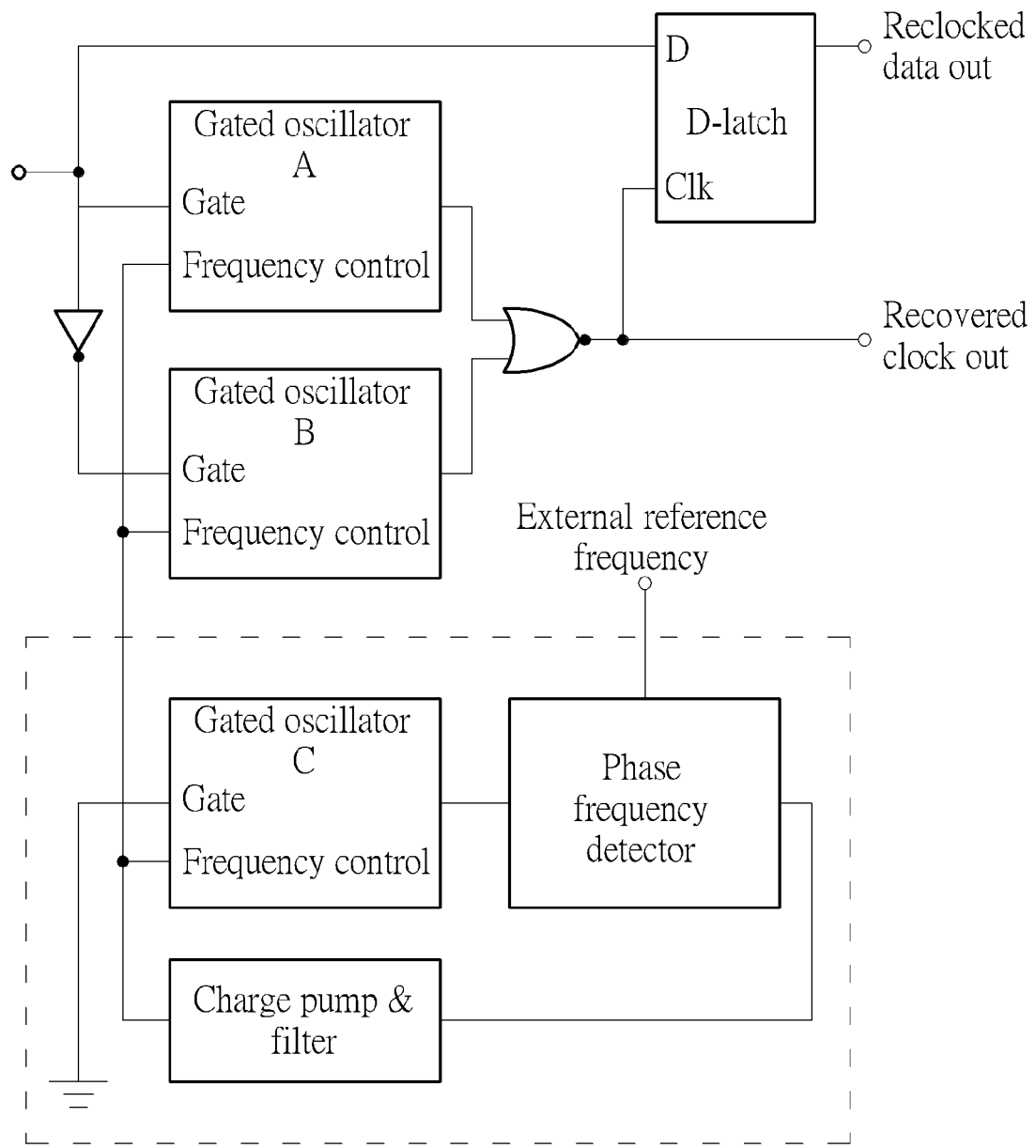
FIG. 1 illustrates a burst mode a clock and data recovery (CDR) circuit according to an embodiment of a prior art.
Figure 2:
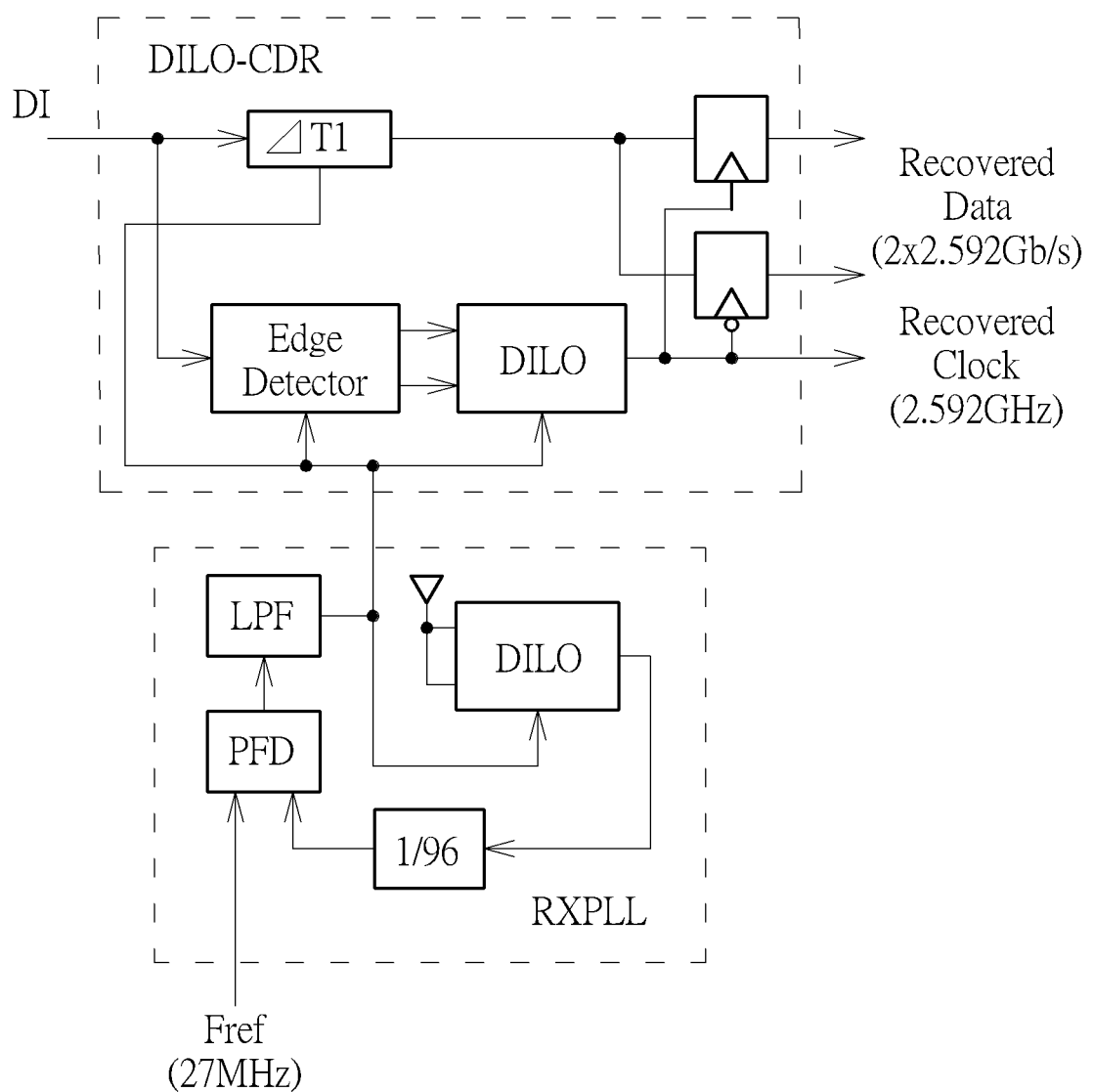
FIG. 2 illustrates an injection lock a clock and data recovery circuit suitable for burst mode operation with a complicated injection scheme.
Figure 3:
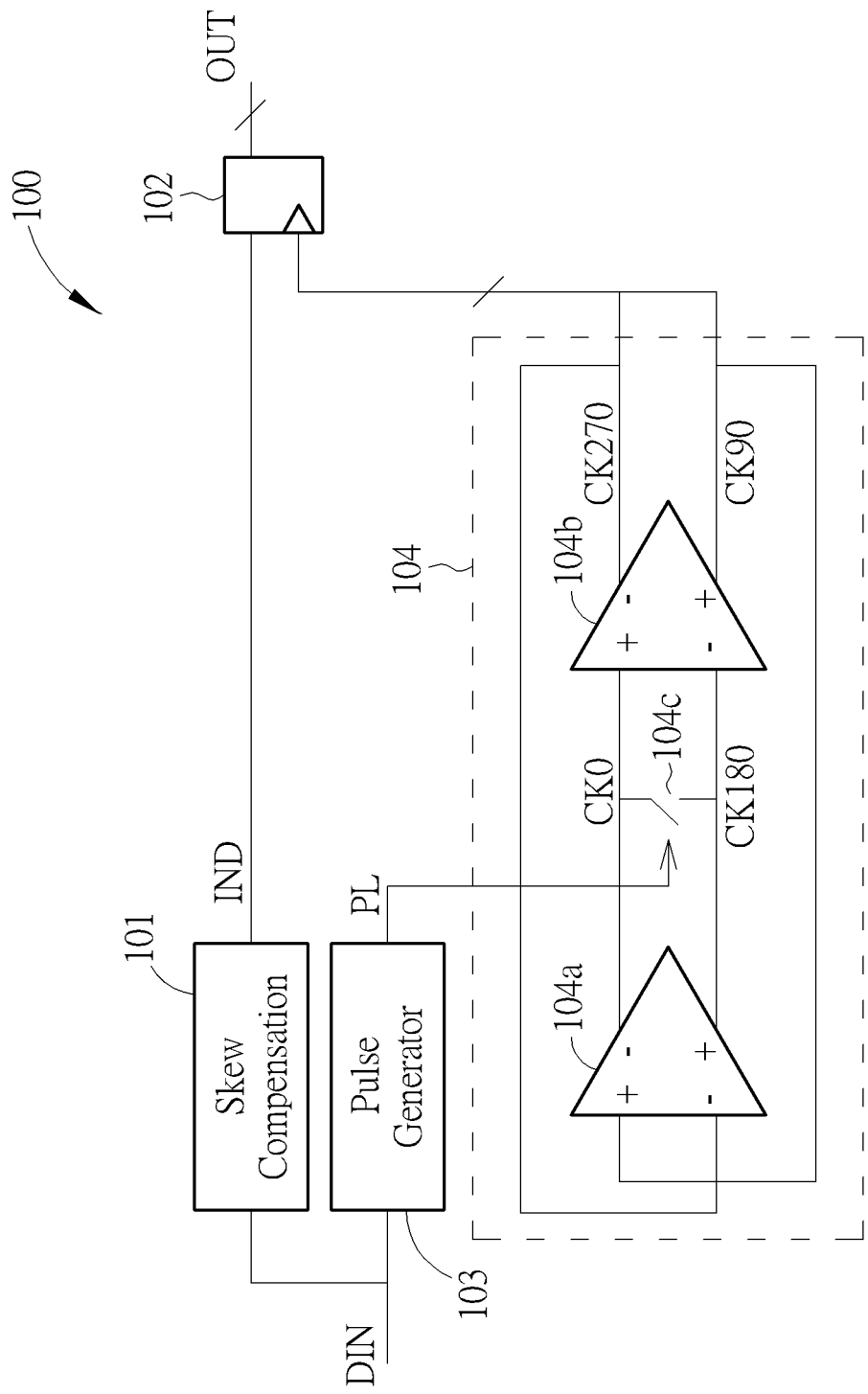
FIG. 3 illustrates a clock and data recovery circuit according to an embodiment of the present invention.

FIG. 3 illustrates a clock and data recovery circuit 100 according to an embodiment of the present invention. The clock and data recovery circuit 100 may comprise a skew compensation block 101, a sampler 102, a pulse generator 103, and an injection locked oscillator 104. The injection locked oscillator 104 may be configured to generate a recovered clock signal. The injection locked oscillator 104 may comprise a two stage ring oscillator and an injection switch 104c. The injection switch 104c may be coupled to the two stage ring oscillator and may be configured to control injection strength of the two stage ring oscillator. The first terminal of the injection switch 104c may be coupled to a first output terminal CK0 of a first ring oscillator stage 104a of the two stage ring oscillator and a first input terminal of a second ring oscillator stage 104b of the two stage ring oscillator. The second terminal of the injection switch 104c may be coupled to a second output terminal CK180 of the first ring oscillator stage 104a of the two stage ring oscillator and a second input terminal of the second ring oscillator stage 104b of the two stage ring oscillator. The control terminal of the injection switch 104c may be coupled to the pulse generator 103. The injection switch 104c may have a programmable gain to control the injection strength of the injection locked oscillator 104. By calibrating the gain, the target bandwidth of the injection locked oscillator 104 may be found. The pulse generator 103 may be coupled to the injection locked oscillator 104 and may be configured to generate a pulse signal PL according to input data DIN for controlling injection locked oscillator 104. The skew compensation block 101 may be coupled to the pulse generator 103 and configured to compensate the input data DIN and generate compensated data IND. The sampler 102 may be coupled to the skew compensation block 102 and a first output terminal CK270 and a second output terminal CK90 of the second ring oscillator stage 104b of the injection locked oscillator 104 and may be configured to sample the compensated data IND according to the recovered clock signal.

Figure 4:
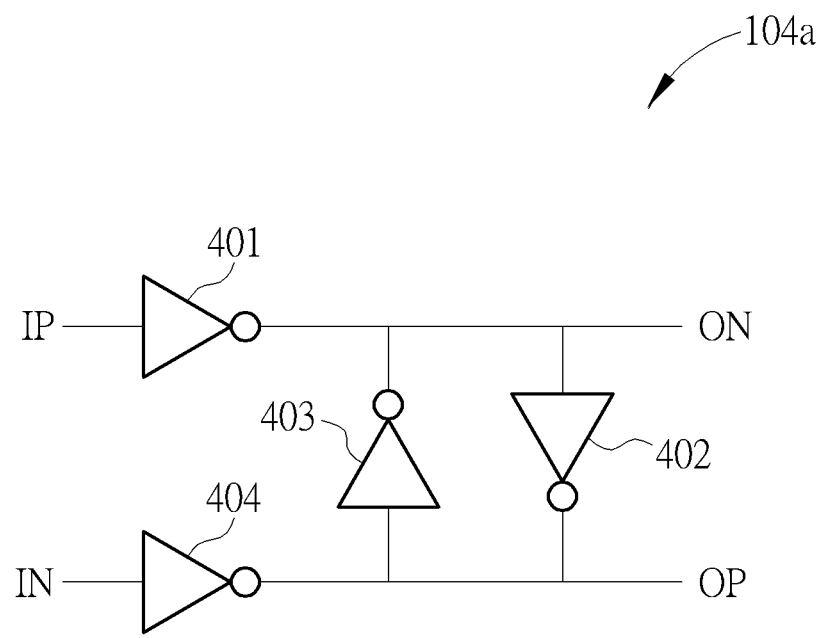
FIG. 4 illustrates a circuit block diagram of one of a ring oscillator stage of the two stage ring oscillator in FIG. 3.

FIG. 4 illustrates a circuit block diagram of one of a ring oscillator stage 104a and 104b of the two stage ring oscillator in FIG. 3. A ring oscillator stage 104a and 104b may comprise of a plurality of delay cells 401, 402, 403, and 404. The first delay cell 401 may have an input terminal and an output terminal. The second delay cell 402 may have an input terminal coupled to the output terminal of the first delay cell 401 and an output terminal. The third delay cell 403 may have an input terminal coupled to the output terminal of the second delay cell 402 and an output terminal coupled to the output terminal of the first delay cell 401. The fourth delay cell 404 may have an input terminal and an output terminal coupled to the input terminal of the third delay cell 403. The input terminal of the second delay cell 402 may be the negative output terminal ON of the ring oscillator stage 104a and 104b and the output terminal of the second delay cell 402 may be the positive output terminal OP of the ring oscillator stage 104a and 104b. The input terminal of the first delay cell 401 may be the positive input terminal IP of the ring oscillator stage 104a and 104b. The input terminal of the fourth delay cell 404 may be the negative input terminal IN of the ring oscillator stage 104a and 104b.

Figure 5:
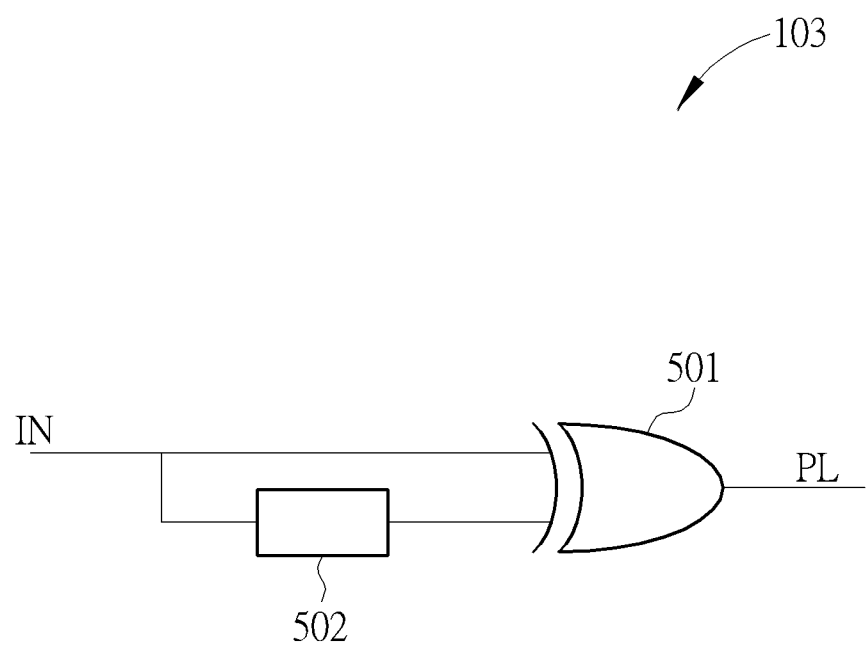
FIG. 5 illustrates a circuit block diagram of the pulse generator in FIG. 3.

FIG. 5 illustrates a circuit block diagram of the pulse generator 103 in FIG. 3. The pulse generator 103 may generate a pulse signal PL according to the rising edge and/or the falling edge of the input data DIN. The pulse generator 103 may comprise a delay cell 502 and a XOR gate 501. The XOR gate 501 may have two input terminals and one output terminal. The input data DIN may be inputted into the delay cell 502 and an input terminal of the XOR gate 501. The output of the delay cell 502 may be inputted to another input terminal of the XOR gate 501. The pulse signal PL may then be generated on the output of the XOR gate 501.

Figure 6:
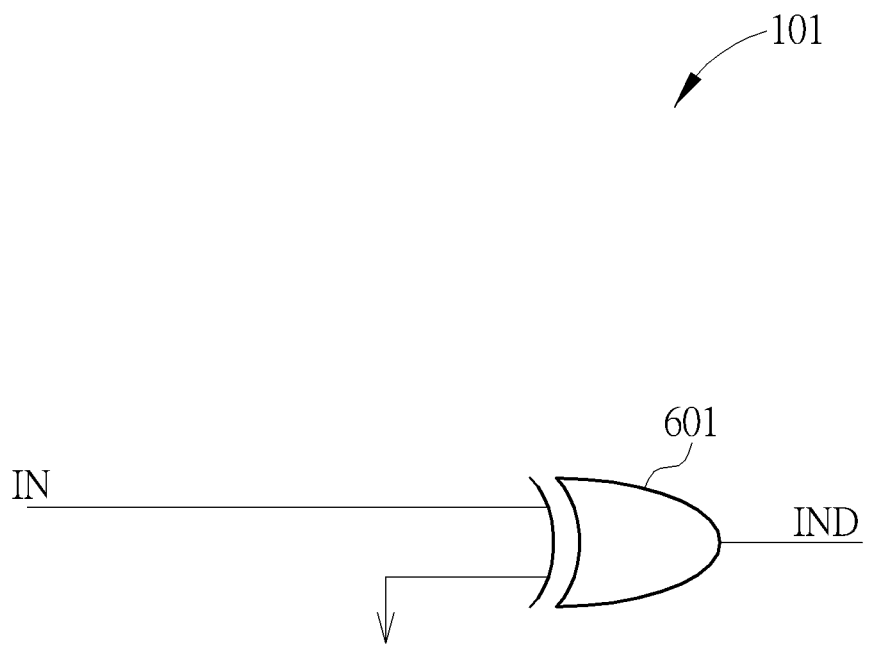
FIG. 6 illustrates a circuit block diagram of the skew compensation block in FIG. 3.

FIG. 6 illustrates a circuit block diagram of the skew compensation block 101 in FIG. 3. The skew compensation block 101 may comprise a XOR gate 601. The XOR gate 601 may have two input terminals and one output terminal. The input data DIN may be inputted into an input terminal of the XOR gate 601. A ground signal may be inputted to another input terminal of the XOR gate 501. The compensated data IND may then be generated on the output of the XOR gate 601.

Figure 7:
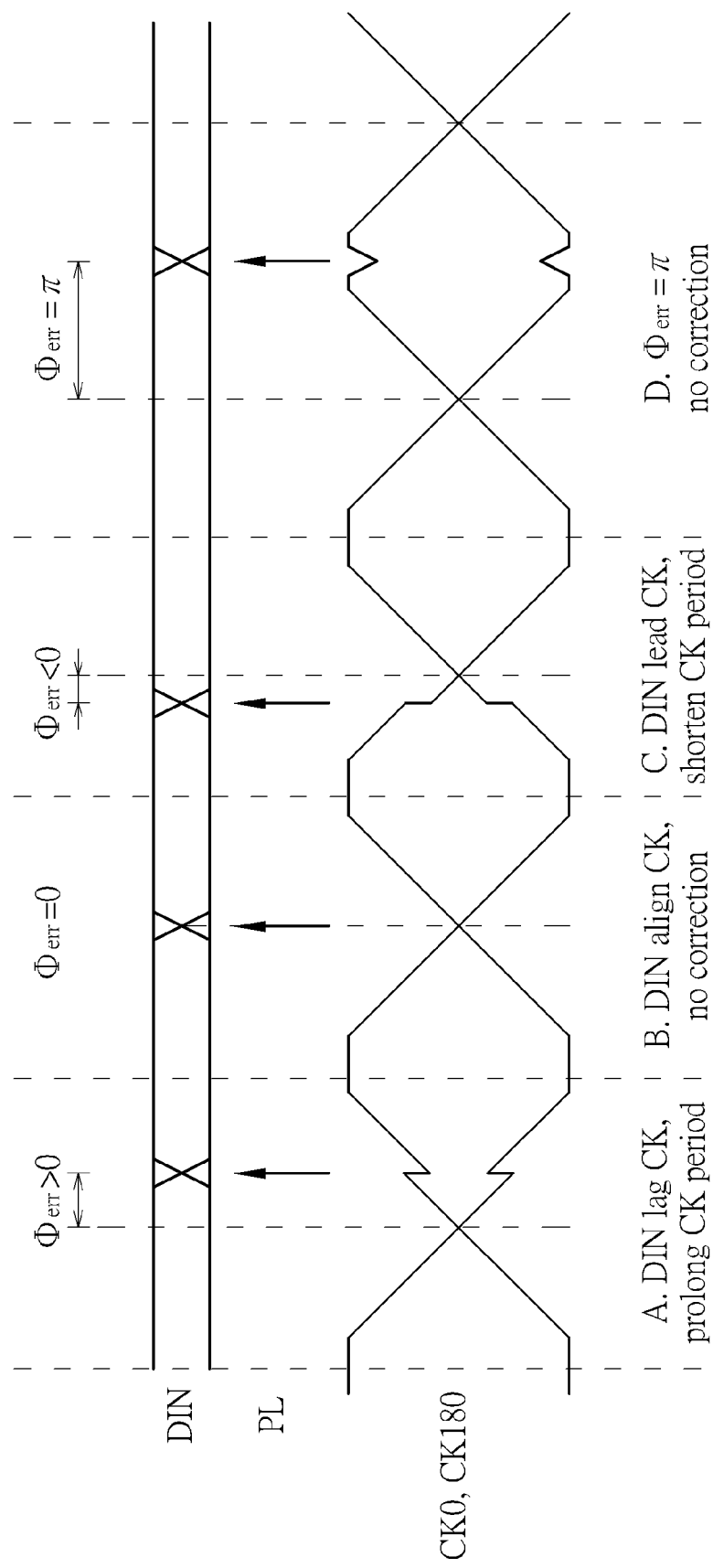
FIG. 7 illustrates an injection locking behavior of the clock and data recovery circuit in FIG. 3.
Figure 8:
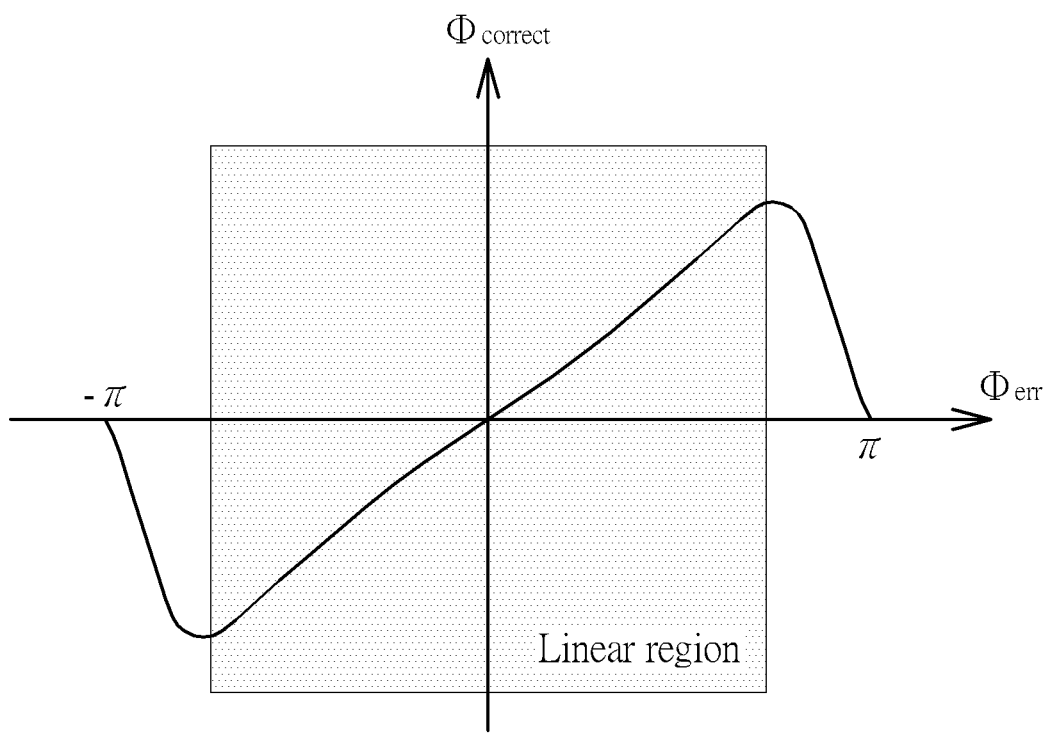
FIG. 8 illustrates a plot of correction phase versus phase error according to the injection locking behavior in FIG. 7.

FIG. 7 illustrates an injection locking behavior of the clock and data recovery circuit 100 in FIG. 3. The phase error may be defined as a phase difference between the pulse signal PL and a cross point of the two stage ring oscillator. For case A, the phase error may be greater than 0, the input data DIN lags the ring oscillator signal, the nodes of the ring oscillator signal may be pulled together and the period of the ring oscillator signal may be prolonged according to the pulse signal PL. For case B, the phase error may be equal to 0 because the pulse signal PL coincides with crossing point of the nodes of the ring oscillator signal. Thus, the period of the ring oscillator signal may not be affected. For case C, the phase error may be less than 0, the pulse signal PL may pull the nodes of ring oscillator signal together and reduce the period of the ring oscillator. For case D, the phase error may be equal to pi ($\pi$) having the ring oscillator signal at maximum voltage and/or minimum voltage pulled together according to the pulse signal PL and the ring oscillator signal may not be affected. FIG. 8 illustrates a plot of correction phase versus phase error according to the injection locking behavior in FIG. 7. For a small phase error $\phi_{err}$, the correction $\phi_{cor}$ may be linear with the phase error $\phi_{err}$. The correction $\phi_{cor}$ may be saturated at larger phase error $\phi_{err}$. And the correction $\phi_{cor}$ may be zero when phase error $\phi_{err}$ is pi ($\pi$).

At equilibrium, the pulse signal PL may be aligned with edge of the ring oscillator signal. If the oscillation frequency of the ring oscillator signal is half of the input data rate, (i.e. half rate clock and data recovery circuit), the signal at the second output terminals of the ring oscillator stages 104a and 104b may align with center of data except for the delay of the pulse generator 103. The skew compensation block 101 may be used to compensate for the delay of the pulse generator 103.

Figure 9:
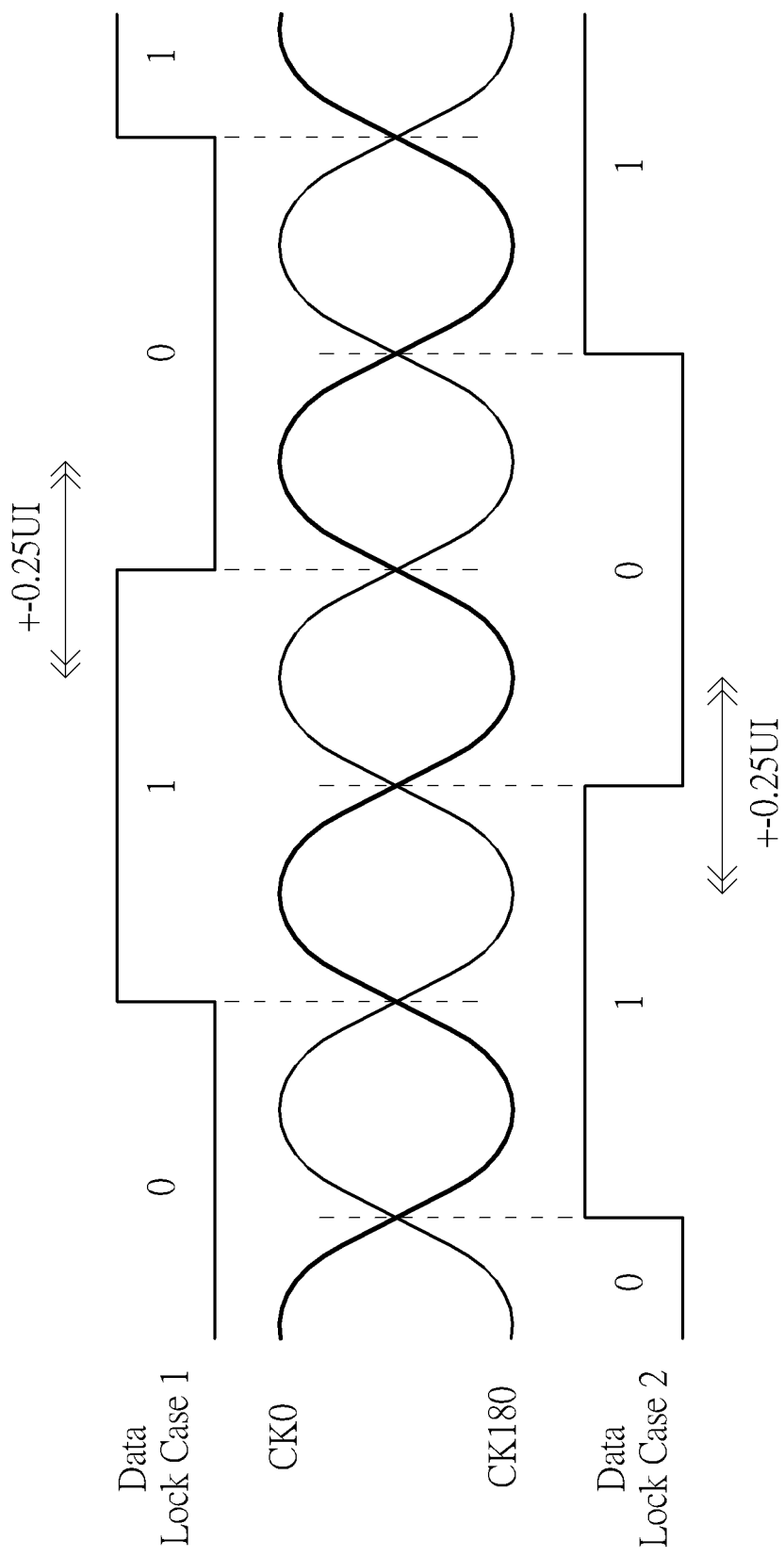
FIG. 9 illustrates a timing diagram of a full rate injection lock clock and data recovery.
Figure 10:
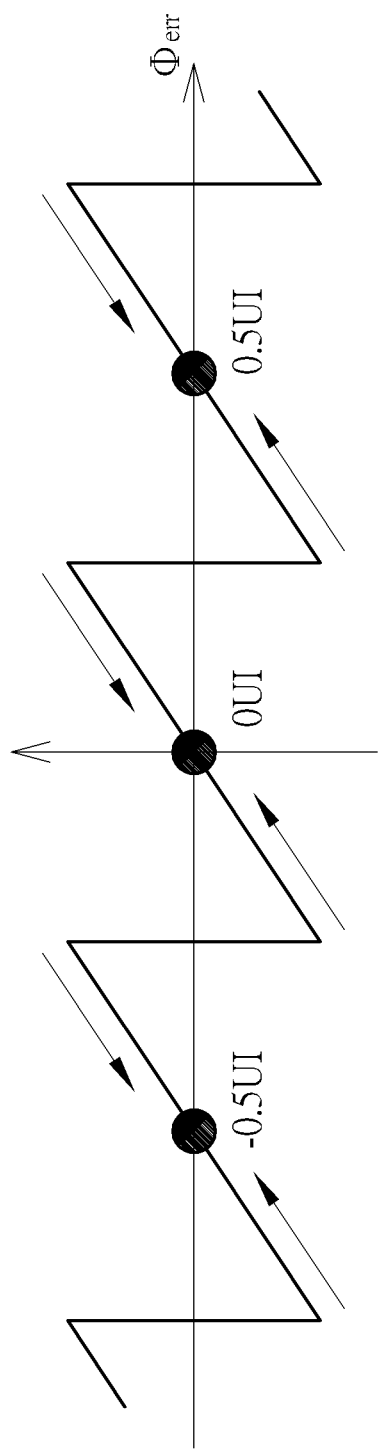
FIG. 10 illustrates the associated pulse detection (PD) output plot.

According to the embodiment, the injection lock clock and data recovery circuit 100 may be suited for a half rate operation. FIG. 9 illustrates a timing diagram of a full rate injection lock clock and data recovery (i.e. period of the ring oscillator signal equals full data rate). Because of full rate operation, two lock states may be possible. In both cases, data transitions align with the zero crossing of the signal at the first output terminal and the second output terminal of the first ring oscillator stages 104a. FIG. 10 illustrates the associated pulse detection (PD) output plot. The two lock points separate only 0.5 unit interval (UI) along phase error axis. If there is jitter amplitude larger than ±0.25 unit interval clock and data recovery may lock to another equilibrium point and produce wrong data. As for the half rate clock and data recovery, the distance between two lock points may be 1 unit interval and may be able to tolerate a maximum ±0.5 unit interval jitter. Thus, the use of a half rate clock and data recovery may be better than the use of a full rate clock and data recovery.

Figure 11:
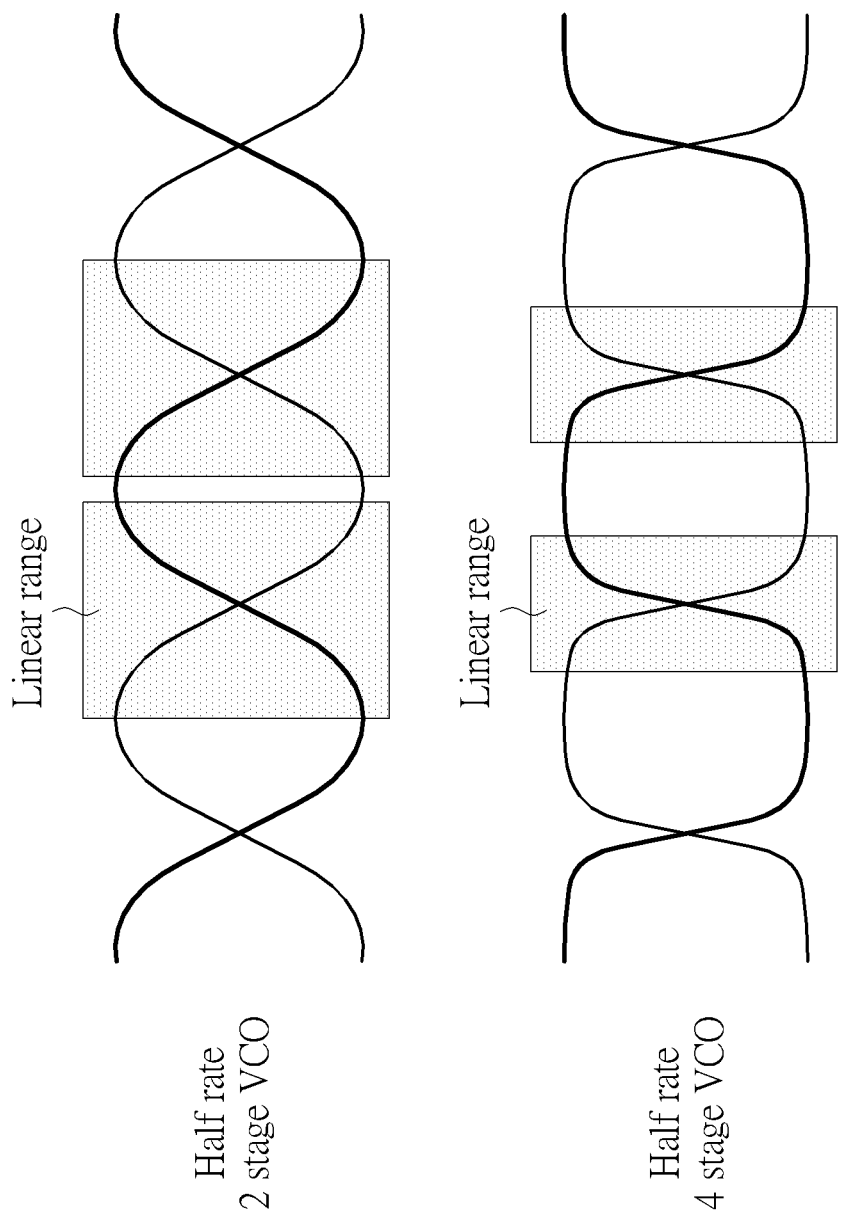
FIG. 11 illustrates a waveform of a four stage ring oscillator and two stage ring oscillator of a half rate clock and data recovery.

According to the embodiment, the two stage ring oscillator may be best suited for injection locked clock and data recovery application. FIG. 11 illustrates a waveform of a four stage ring oscillator and two stage ring oscillator of a half rate clock and data recovery. For the four stage ring oscillator, the ring oscillator node may spend more time staying at maximum/minimum voltage where there is no injection gain. The linear range spans at most ±0.25 UI as compared to ±0.5 UI of the two stage ring oscillator. The shrunk linear range results in null loop response when jitter lies outside ±0.25 UI. Thus the use of a two stage ring oscillator may be more suitable for injection locked clock and data recovery application as compared to a four stage ring oscillator.

In the above description, the oscillation frequency of the ring oscillator may be assumed to be half of the input data rate. If there is a frequency offset between the oscillation frequency of the ring oscillator and input data rate, steady state phase offset and data jitter may be developed between recovered clock and input data to degrade timing margin of the sampler. If the frequency offset is greater than a predetermined threshold, the clock and data recovery may lose lock. Therefore, it is important to track the natural oscillation frequency of the ring oscillator to input data rate against temperature and voltage variation. Prior art uses a phase locked loop (PLL) with a replica of the ring oscillator to track frequency which may be power and area consuming.

Figure 12:
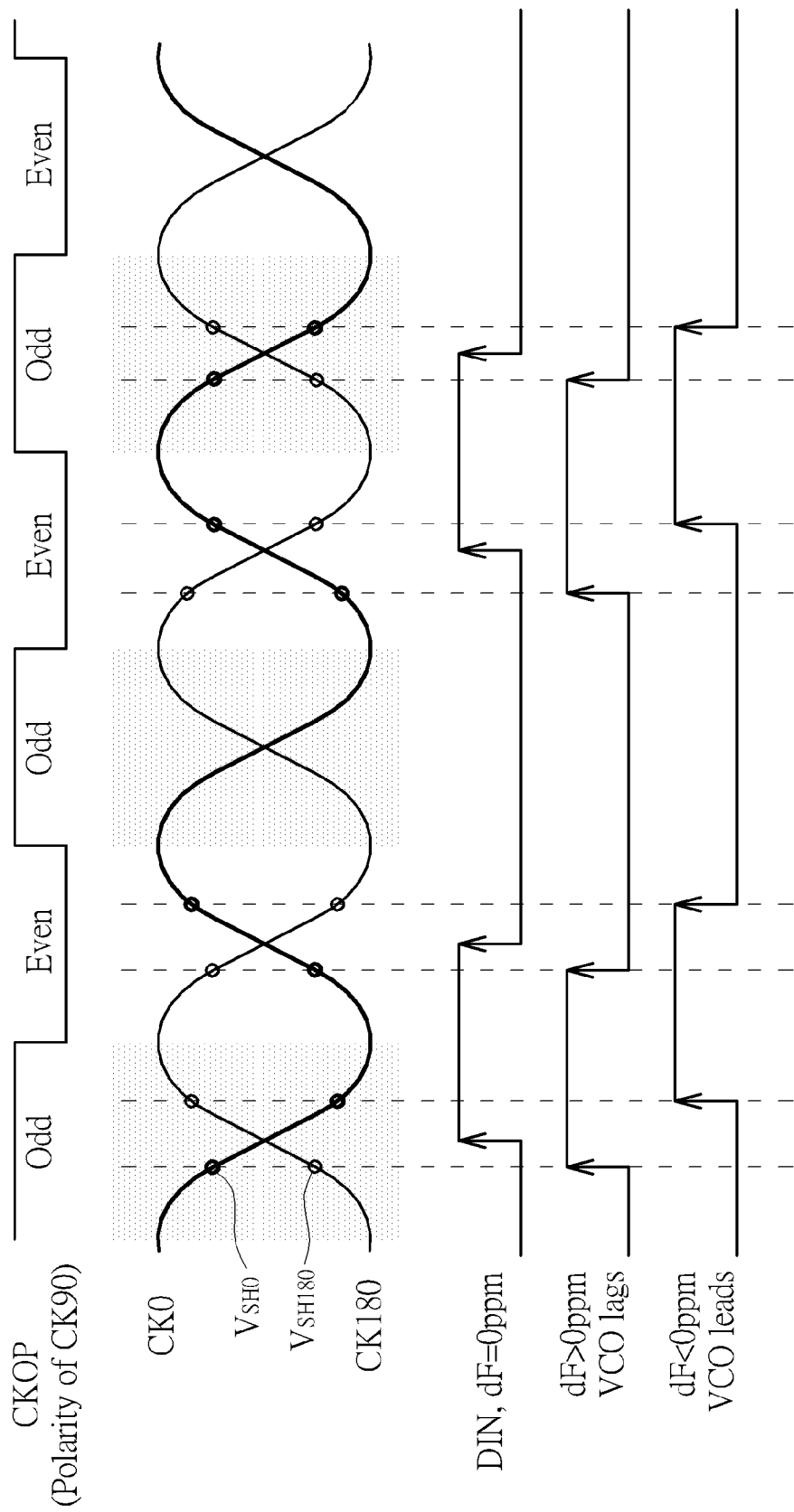
FIG. 12 illustrates a waveform representing the operation principle of the two stage ring oscillator of the clock and data recovery in FIG. 3.

The relationship between the frequency of incoming data and the ring oscillator may be illustrated by comparing the waveform of the ring oscillator at the instant of data transition. Because the ring oscillator oscillates in half rate frequency, the relationship may depend on data transition in odd or even cycle of the ring oscillator. FIG. 12 illustrates a waveform representing the operation principle of the two stage ring oscillator of the clock and data recovery 100 in FIG. 3. When half rate of the input data DIN is larger than the frequency of the ring oscillator (dF>0), voltage VSHCK0 at the terminal CK0 of the two stage ring oscillator may be greater than voltage VSHCK180 at the terminal CK180 of the two stage ring oscillator during odd cycle and voltage VSHCK0 at the terminal CK0 of the two stage ring oscillator may be less than voltage VSHCK180 at the terminal CK180 of the two stage ring oscillator during even cycle. When half rate of input data DIN is smaller than the frequency (dF<0) of the ring oscillator, voltage VSHCK0 at the terminal CK0 of the two stage ring oscillator may be less than voltage VSHCK180 at the terminal CK180 of the two stage ring oscillator during odd cycle and voltage VSHCK0 at the terminal CK0 of the two stage ring oscillator may be greater than voltage VSHCK180 at the terminal CK180 of the two stage ring oscillator during even cycle. When half data rate is equal to the frequency of the ring oscillator, the voltage VSHCK0 at the terminal CK0 of the two stage ring oscillator may be equal to the voltage VSHCK180 at the terminal CK180 of the two stage ring oscillator. The waveform of the ring oscillator may be sampled and hold in capacitors according to data transition during even cycles or odd cycles.

Figure 13:
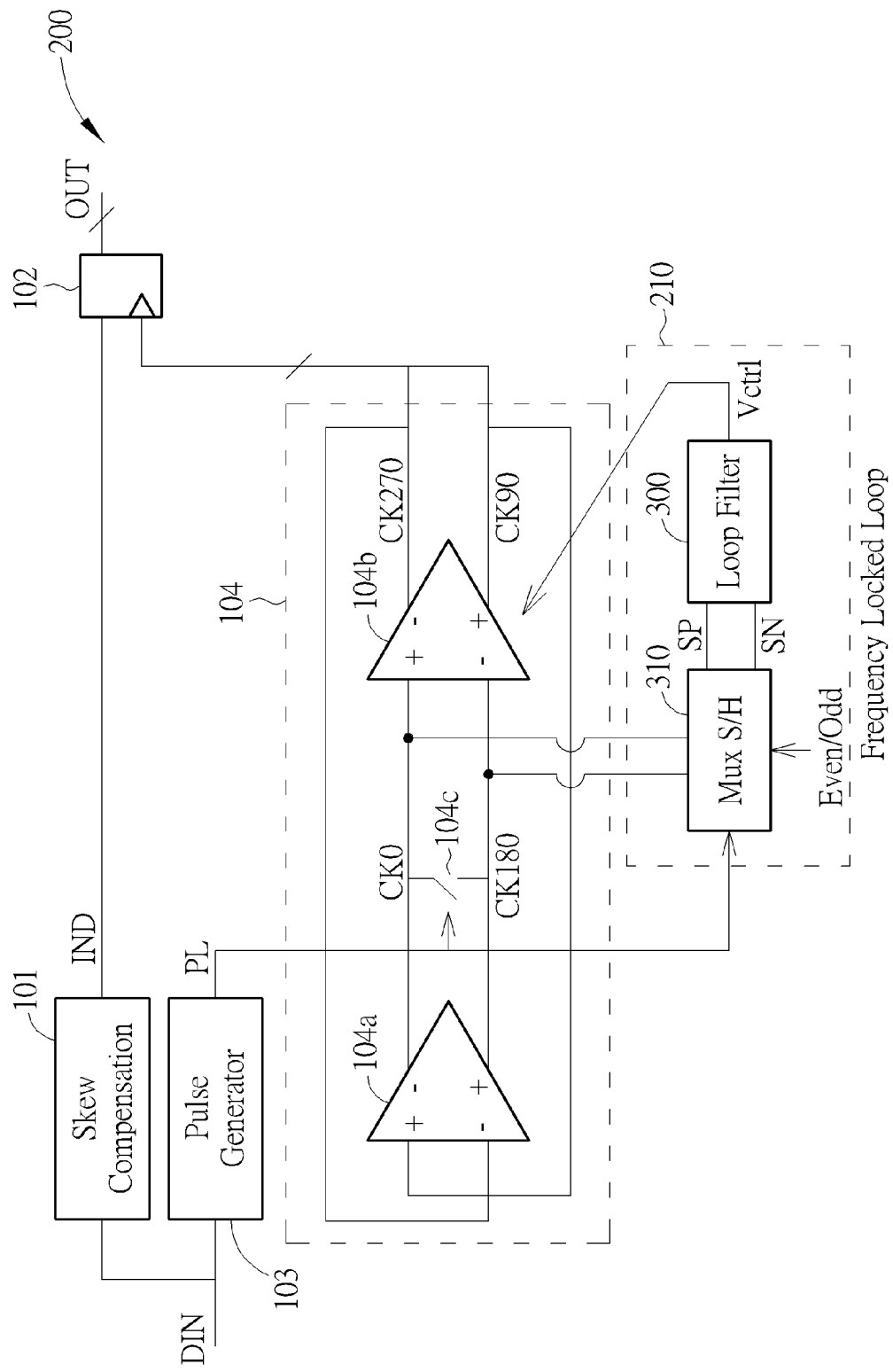
FIG. 13 illustrates a clock and data recovery circuit according to another embodiment of the present invention.

FIG. 13 illustrates a clock and data recovery circuit 200 according to another embodiment of the present invention. Aside from components comprising the clock and data recovery circuit 100, the clock and data recovery circuit 200 further comprises a frequency lock loop 210. The frequency locked loop 210 may comprise a multiplexed (Mux) sample and hold (S/H) circuit 310 and a loop filter 300. The multiplexed sample and hold circuit 310 may sample voltages of the terminal CK0 and the terminal CK180 of the two stage ring oscillator according to the pulse signal PL while injection locking the clock and data recovery circuit 200 and store the sampled voltage in a capacitor according to the even cycle or the odd cycle of the two stage ring oscillator. The sampled voltages are coupled to the loop filter 300 and the output of loop filter 300 may be a control voltage Vctrl used to control the ring oscillator frequency in a negative feedback way. Therefore, the ring oscillator frequency may be tracked to maintain a frequency of half the input data rate continuously.

Figure 14:
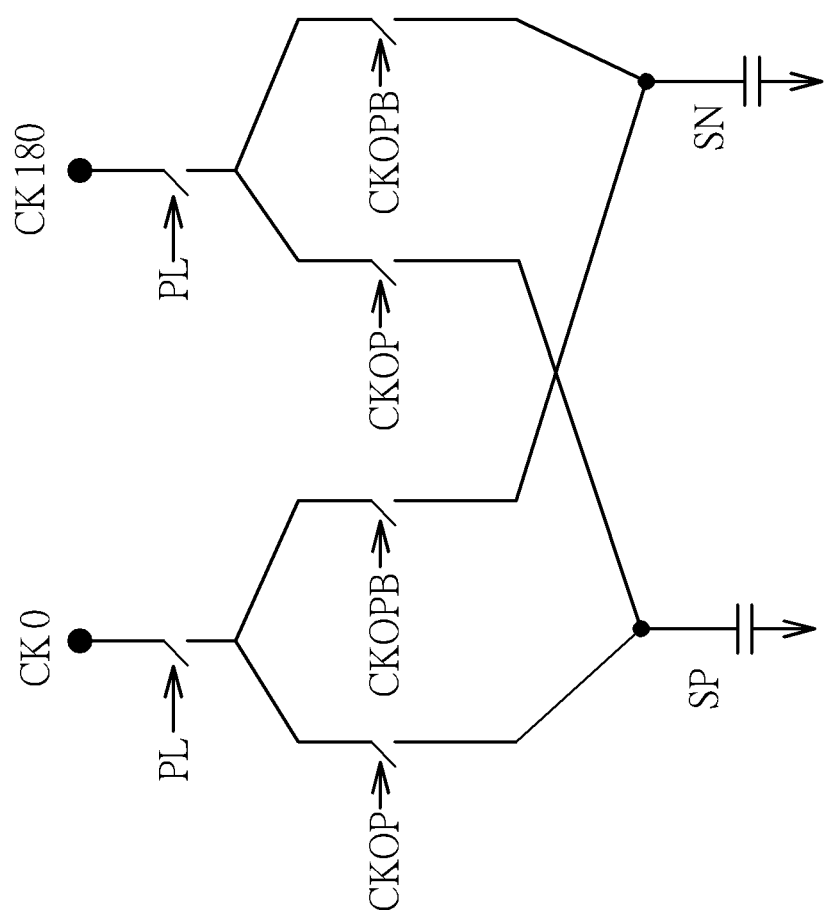
FIG. 14 illustrates a multiplexed sample and hold circuit according to an embodiment of the present invention.

FIG. 14 illustrates a multiplexed sample and hold circuit 310 according to an embodiment of the present invention. The sampled voltage is multiplexed through a positive sample terminal SP or a negative sample terminal SN of the multiplexed sample and hold circuit 310 according signals CKOP and CKOPB. The signals CKOP and CKOPB may correspond to the polarity of the signals from the terminal CK90 and the terminal CK270 respectively. There may be a total of two series switch between the terminal CK0 or the terminal CK180 and positive sample terminal SP or a negative sample terminal SN.

Figure 15:
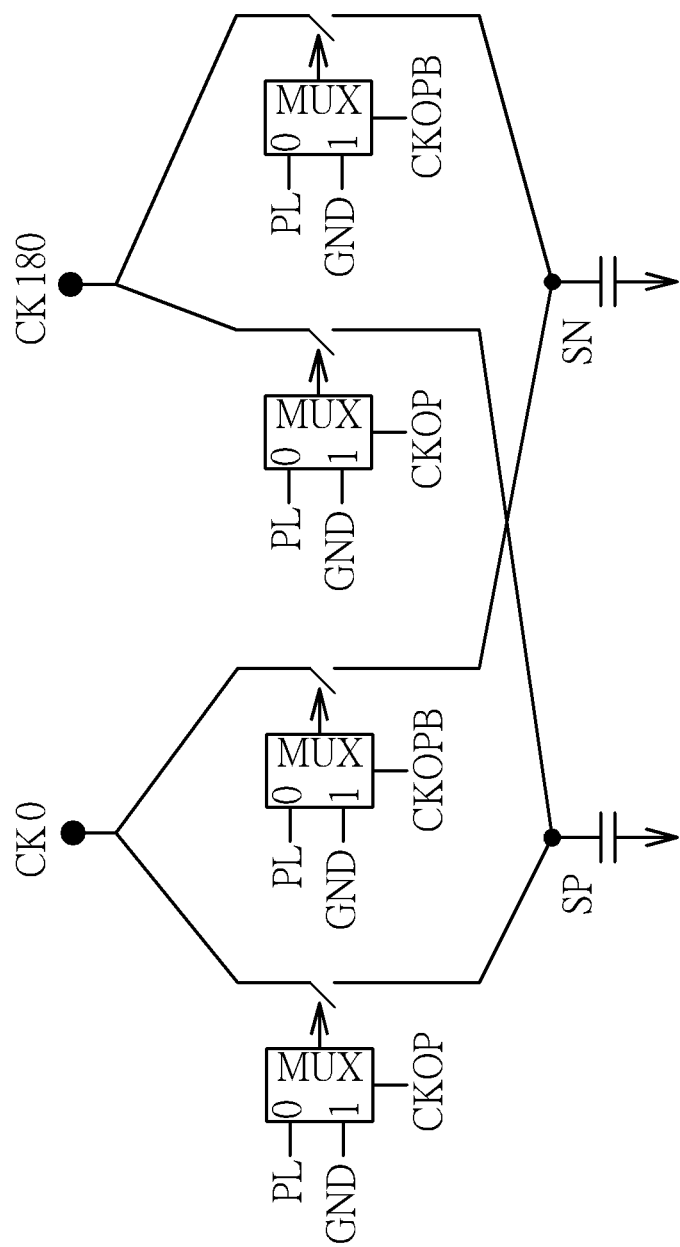
FIG. 15 illustrates a multiplexed sample and hold circuit according to another embodiment of the present invention.

FIG. 15 illustrates a multiplexed sample and hold circuit 310 according to another embodiment of the present invention. The pulse signal PL may be multiplexed by the signal CKOP before coupling to the sample switch. There may only one series switch between the terminal CK0 or the terminal CK180 and a positive sample terminal SP or a negative sample terminal SN.

Figure 16:
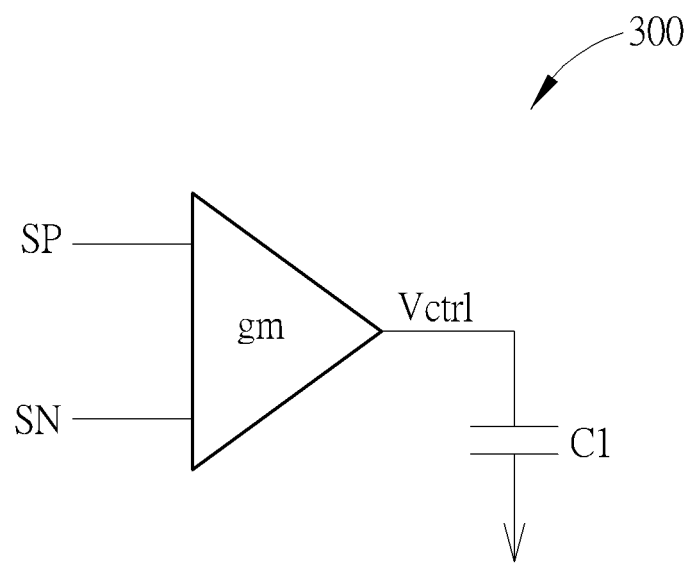
FIG. 16 illustrates an embodiment of a loop filter of the frequency lock loop of the clock and data recovery circuit in FIG. 13.

FIG. 16 illustrates an embodiment of a loop filter 300 of the frequency locked loop 210 of the clock and data recovery circuit 200 in FIG. 13. The loop filter 300 may be an analog transconductance capacitance filter. The loop filter 300 may comprise a transconductance amplifier gm and a capacitor c1. The transconductance amplifier gm may have a first input terminal coupled to the positive sample terminal SP, a second input terminal coupled to the negative sample terminal SN and an output terminal where a control voltage Vctrl may be outputted and used to control the frequency of the two stage ring oscillator. The capacitor c1 may have a first terminal coupled to the output terminal and a second terminal coupled to the ground. The tranconductance value and capacitance value may be calculated such that the bandwidth of the loop filter 300 may be low enough to avoid disturbing the injection locking of the clock and data recovery circuit 300.

Figure 17:
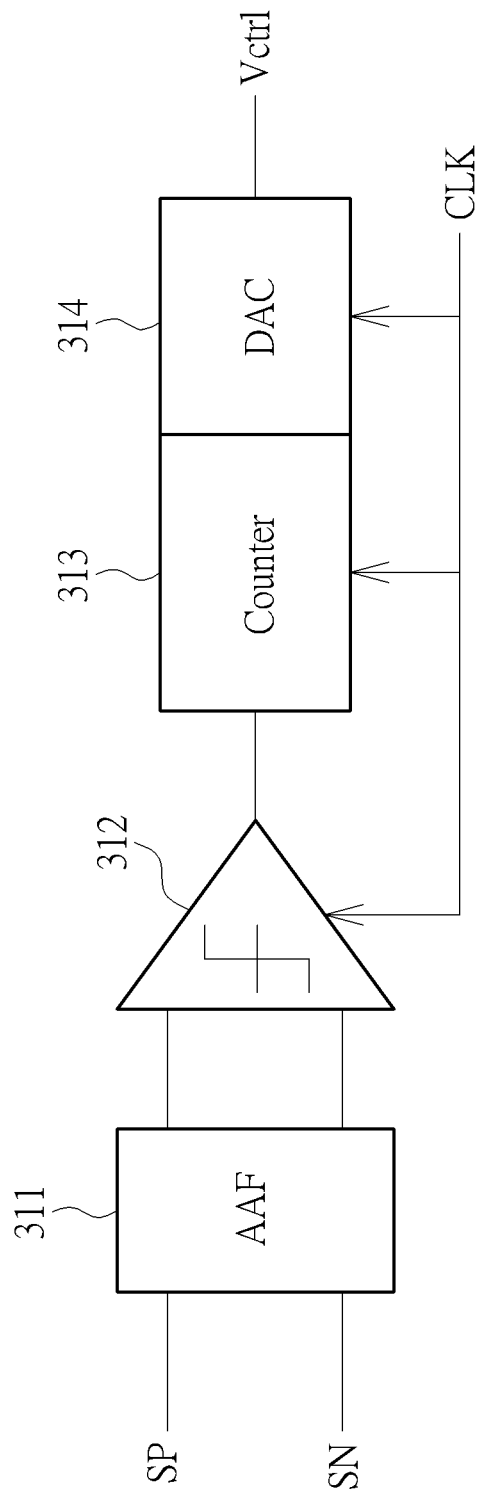
FIG. 17 illustrates another embodiment of the loop filter of frequency locked loop of the clock and data recovery circuit in FIG. 13.

FIG. 17 illustrates another embodiment of the loop filter 300 of frequency locked loop 210 of the clock and data recovery circuit 200 in FIG. 13. The loop filter 300 of frequency locked loop 210 may use a digital approach. The loop filter 300 may comprise an anti-aliasing filter (AAF) 311, a comparator 312, counter 313, and a digital to analog converter (DAC) 314. The comparator 312, the counter 313 and the digital to analog converter (DAC) 314 may be coupled to a clock signal CLK. The results of the multiplexed sample and hold circuit 310 may be filtered by the anti-aliasing filter 311, compared and integrated by the counter 312 and outputted to the digital-to-analog converter 314. The digital-to-analog converter 314 may output the control voltage Vctrl used to control the frequency of the ring oscillator in a negative feedback. The bandwidth of the frequency lock loop 310 may be low enough to avoid disturbing the injection locking of the clock and data recovery circuit 300.

Figure 18:
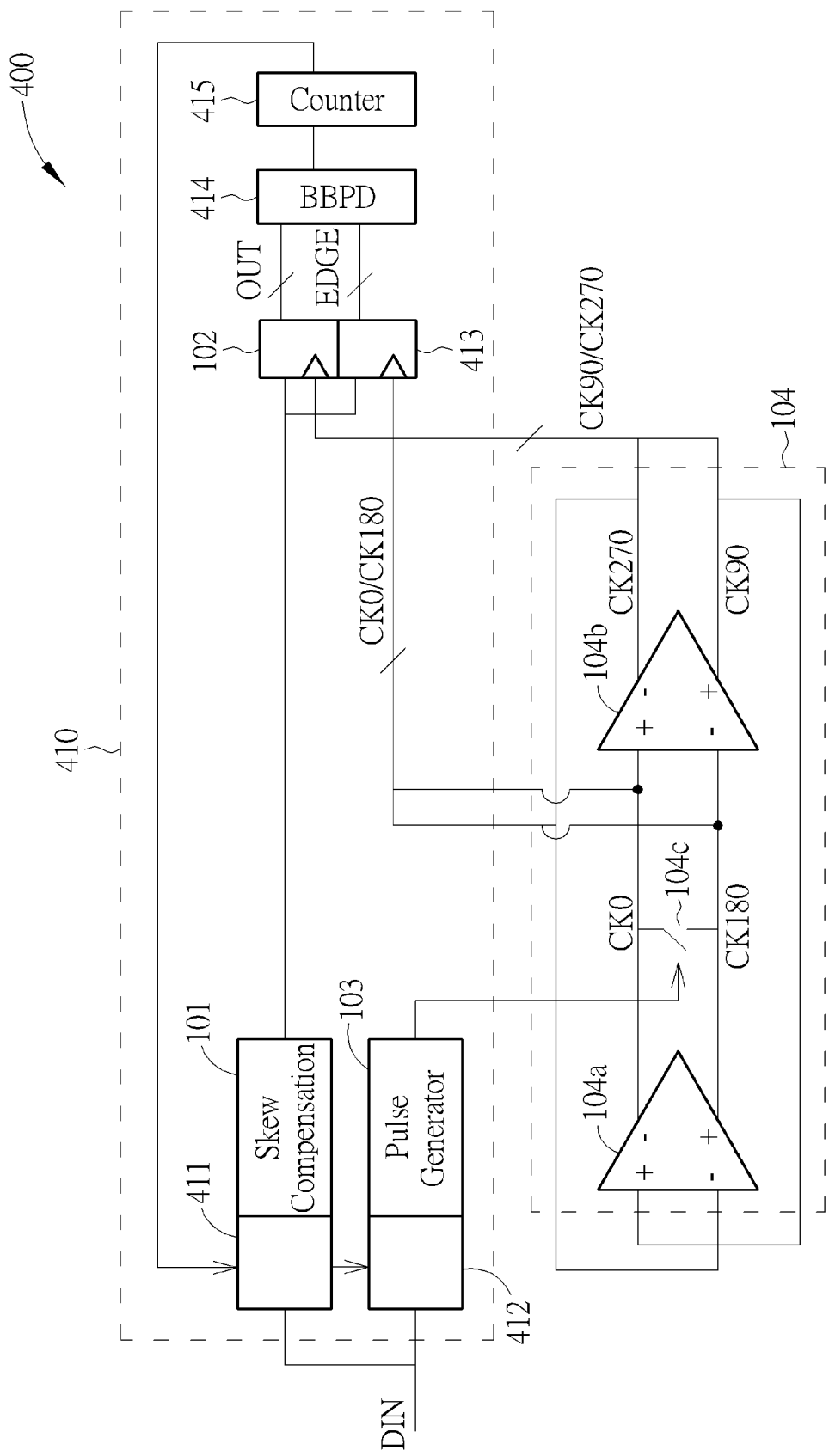
FIG. 18 illustrates a clock and data recovery circuit according to another embodiment of the present invention.

FIG. 18 illustrates a clock and data recovery circuit 400 according to another embodiment of the present invention. Aside from components of the clock and data recovery circuit 100, the clock and data recovery circuit 400 further comprises a delay lock loop 410. The delay lock loop 410 may comprise of at least one delay adjustment circuits 411 or 412, an edge sampler 413, a bang-bang phase detector (BBPD) 414 and a counter 415. The delay adjustment circuit 411 may be coupled to the skew compensation block 101 and the delay adjustment circuit 412 may be coupled to the pulse generator 103. The delay locked loop 410 may have a bandwidth that is low enough to avoid disturbing injection lock of the clock and data recovery circuit but is fast enough to track optimum sampling point under voltage and temperature variation in a continuous locking process.

Figure 19:
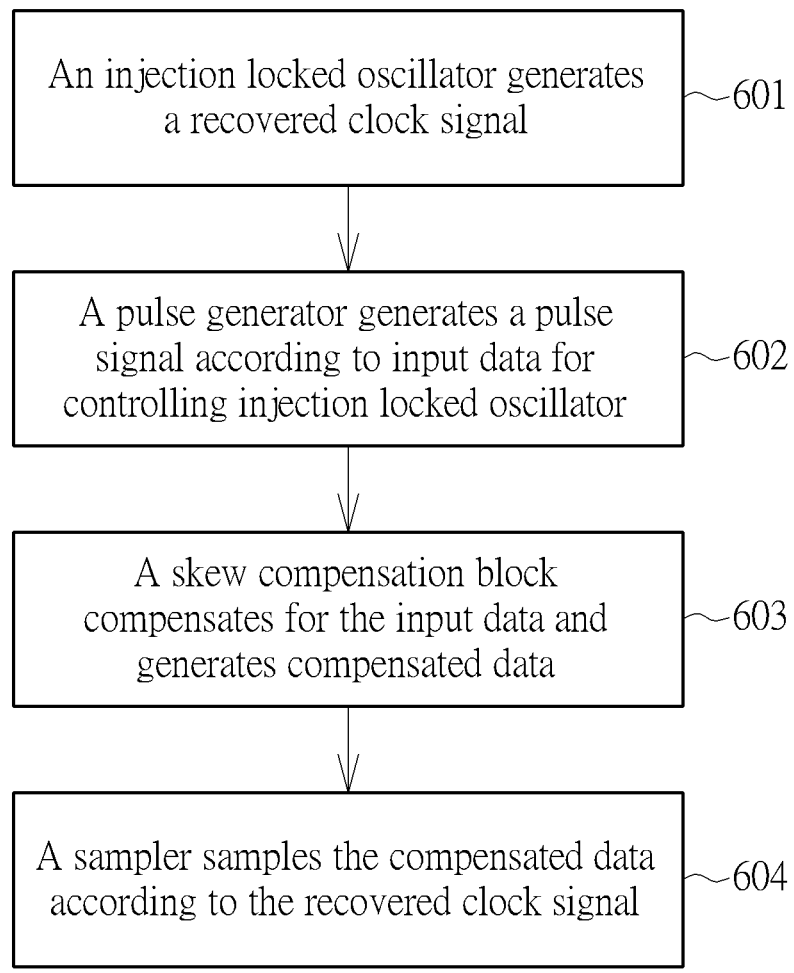
FIG. 19 illustrates a method of operation of the clock and data recovery circuit in FIG. 3.

FIG. 19 illustrates a method of operation of the clock and data recovery circuit 100 in FIG. 3. The method may include but is not limited to the following steps:

Step 601: An injection locked oscillator generates a recovered clock signal;

Step 602: A pulse generator generates a pulse signal according to input data for controlling injection locked oscillator;

Step 603: A skew compensation block compensates for the input data and generating compensated data; and Step 604: A sampler sampling the compensated data according to the recovered clock signal.

The method of operation of the clock and data recovery circuit 100 may further comprise of a frequency locked loop correcting a frequency error of the injection locked oscillator, or a delay locked loop finding an optimal sampling point of the recovered data.

The frequency locked loop may detect the frequency error between the injection locked oscillator and incoming data rate by a sample and hold circuit sampling a voltage of an injected terminal of the ring oscillator and storing the voltage in a hold capacitor according to even or odd cycle of the ring oscillator. The frequency error is further inputted to loop filter and control ring oscillator in negative feedback.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock and data recovery circuit, comprising:
   an injection locked oscillator configured to generate a recovered clock signal, the injection locked oscillator comprising:
      a two stage ring oscillator; and
      an injection switch coupled to the two stage ring oscillator;
   a pulse generator coupled to the injection locked oscillator and configured to generate a pulse signal according to input data for controlling the injection locked oscillator;
   a sampler coupled to the input data and the injection locked oscillator and configured to sample the input data according to the recovered clock signal; and
   a skew compensation block coupled to the input data and configured to compensate the input data and generate compensated data to be sampled by the sampler.

2. The circuit of claim 1, where the ring oscillator operates at half of an incoming data rate.

3. The circuit of claim 1, further comprising:
   a frequency locked loop coupled to the injection locked oscillator and configured to correct a frequency error in the injection locked oscillator.

4. The circuit of claim 3, wherein the frequency locked loop comprises:
   a sample and hold circuit coupled to the pulse generator and the injection locked oscillator and configured to sample a voltage of an injection terminal of the injection locked oscillator and store the voltage in a hold capacitor according to an even cycle or an odd cycle of the injection locked oscillator; and
   a loop filter configured to receive a voltage from the sample and hold circuit and generate a control voltage to control the injection lock oscillator; the loop filter further controls the bandwidth of the frequency locked loop such that the bandwidth of the frequency locked loop is low enough to avoid disturbing injection locking of the clock and data recovery circuit.

5. The circuit of claim 1, further comprising:
   a delay locked loop coupled to the injection locked oscillator and configured to find an optimal sampling point of the recovered data;
   wherein bandwidth of the delay locked loop is low enough to avoid disturbing injection locking of the clock and data recovery circuit.

6. The circuit of claim 1, wherein the two stage ring oscillator comprises:
   a first oscillator stage having a first input terminal, a second input terminal, a first output terminal, and a second output terminal; and
   a second oscillator stage having a first input terminal coupled to the first output terminal of the first oscillator stage, a second input terminal coupled to the second output terminal of the first oscillator stage, a first output terminal coupled to the second input terminal of the first oscillator stage, and a second output terminal coupled to the first input terminal of the first oscillator stage.

7. The circuit of claim 6, wherein each oscillator stage of the two stage ring oscillator comprises:
   a first delay cell having an input terminal and an output terminal;
   a second delay cell having an input terminal and an output terminal;
   a third delay cell having:
      an input terminal coupled to the output terminal of the second delay cell; and
      an output terminal coupled to the output terminal of the first delay cell; and
   a fourth delay cell having:
      an input terminal coupled to the output terminal of the first delay cell; and
      an output terminal coupled to the output terminal of the second delay cell.

8. A method of operation of a clock and data recovery circuit, the clock and data recovery circuit comprising:
   an injection locked oscillator configured to generate a recovered clock signal, the injection locked oscillator comprising:
      a two stage ring oscillator; and
      an injection switch coupled to the two stage ring oscillator;
   a pulse generator coupled to the injection locked oscillator and configured to generate a pulse signal according to input data for controlling the injection locked oscillator; and
   a sampler coupled to the input data and the injection locked oscillator and configured to sample the input data according to the recovered clock signal; and
   a skew compensation block coupled to the input data and configured to compensate the input data and generate compensated data to be sampled by the sampler;
   the method comprising:
   the injection locked oscillator generating the recovered clock signal;
   the pulse generator generating the pulse signal according to the input data for controlling the injection locked oscillator; and
   the sampler sampling the input data according to the recovered clock signal.

9. The method of claim 8, further comprising:
   the skew compensation block compensating the input data.

10. The method of claim 8, further comprising:
    a frequency locked looped correcting a frequency error of the injection locked oscillator.

11. The method of claim 10, wherein the frequency locked looped correcting a frequency error of the injection locked oscillator comprises:
    a sample and hold circuit sampling a frequency from the injection locked oscillator and storing the frequency in a hold capacitor of the sample and hold circuit; and a loop filter receiving a voltage from the sample and hold circuit and generating a control voltage to control the injection lock oscillator.

12. The method of claim 8, further comprising:
a delay locked loop finding an optimal sampling point of the recovered data.

13. The method of claim 12, wherein the delay locked loop operates at a lower clock frequency than the injection locked oscillator.

\* \* \* \* \*